(12) United States Patent
Jin et al.

(10) Patent No.: US 10,483,231 B2
(45) Date of Patent: *Nov. 19, 2019

(54) BONDING METHOD OF FIXING AN OBJECT TO A ROUGH SURFACE

(71) Applicants: Tsinghua University, Beijing (CN); HON HAI PRECISION INDUSTRY CO., LTD., New Taipei (TW)

(72) Inventors: Xiang Jin, Beijing (CN); Zi-Peng Wu, Beijing (CN); Wen-Tao Miao, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/143,508

(22) Filed: Sep. 27, 2018

(65) Prior Publication Data

US 2019/0206830 A1     Jul. 4, 2019

(30) Foreign Application Priority Data

Dec. 28, 2017 (CN) .......................... 2017 1 1464112

(51) Int. Cl.
*H01L 21/30* (2006.01)
*H01L 23/00* (2006.01)
*C01B 32/158* (2017.01)

(52) U.S. Cl.
CPC ............ *H01L 24/83* (2013.01); *C01B 32/158* (2017.08); *H01L 24/05* (2013.01); *H01L 2224/83048* (2013.01); *H01L 2224/83493* (2013.01)

(58) Field of Classification Search
CPC ... H01L 21/02601; H01L 24/05; H01L 24/83; H01L 51/0048; C01B 32/158
USPC ......................................... 438/455; 977/742
See application file for complete search history.

(56) References Cited

U.S. PATENT DOCUMENTS

| 8,702,897 B2* | 4/2014 | Lin ........................ B82Y 30/00 156/322 |
| 2016/0059534 A1* | 3/2016 | Balachandra ....... B29C 65/1435 156/151 |

* cited by examiner

*Primary Examiner* — Brook Kebede
(74) *Attorney, Agent, or Firm* — ScienBiziP, P.C.

(57) ABSTRACT

A bonding method is provided. A sheet structure is placed on a substrate surface, and a surface roughness of a surface of the sheet structure is less than or equal to 1.0 micrometer. A carbon nanotube structure is laid on the surface of the sheet structure. Two ends of the carbon nanotube structure are in direct contact with the substrate surface. An organic solvent is added to the two ends of the carbon nanotube structure. An object is laid on the carbon nanotube structure, and a surface of the object being in direct contact with the carbon nanotube structure has a surface roughness less than or equal to 1.0 micrometer.

20 Claims, 9 Drawing Sheets placing a sheet structure on and in direct contact with a substrate surface of a substrate, wherein the sheet structure comprises a first surface and a second surface opposite to the first surface, the first surface is in direct contact with the substrate surface, and the second surface is a smooth surface ——S1 laying a carbon nanotube structure on and in direct contact with the second surface, wherein the carbon nanotube structure comprises a first portion, a second portion, and a third portion, the first portion and the second portion are connected together by the third portion, the first portion and the second portion extend out of the second surface and are in direct contact with the substrate surface, the third portion is in direct contact with the sheet structure. The carbon nanotube structure comprises a super-aligned carbon nanotube film. The super-aligned carbon nanotube film comprises a plurality of carbon nanotubes, the plurality of carbon nanotubes extend substantially along a same direction, and an extending direction of the plurality of carbon nanotubes is substantially parallel to a surface of the super-aligned carbon nanotube film ——S2 adding an organic solvent to the first portion and the second portion, to fix the sheet structure on the substrate surface only by the carbon nanotube structure ——S3 laying an object on and in direct contact with the third portion, wherein the carbon nanotube structure is located between the sheet structure and the object, a surface of the object being in direct contact with the carbon nanotube structure is a smooth surface ——S4 applying a pressure to the object to make the object bonded to the substrate surface and forming a structure comprising the substrate, the sheet structure, the carbon nanotube structure and the object ——S5

BONDING METHOD OF FIXING AN OBJECT TO A ROUGH SURFACE

CROSS-REFERENCE TO RELATED APPLICATIONS

This application claims all benefits accruing under 35 U.S.C. § 119 from China Patent Application No. 201711464112.2, filed on Dec. 28, 2017, in the China Intellectual Property Office, the contents of which are hereby incorporated by reference. The application is also related to copending applications entitled, "DOUBLE-SIDED TAPE WITH EXTENDED TEMPERATURE RANGE", Ser. No. 16/119,635 filed Aug. 31, 2018. The application is also related to copending applications entitled, "BONDING METHOD USING A CARBON NANOTUBE STRUCTURE", Ser. No. 16/119,700 filed Aug. 31, 2018.

FIELD

The present disclosure relates to a bonding method, and more particularly, relates to a bonding method of fixing an object to a rough surface using a carbon nanotube structure.

BACKGROUND

In conventional bonding methods, double-sided tape or adhesive is used for bonding and fixing objects. In many experiments, the objects bonded together by the double-sided tape or adhesive would be treated at high or low temperatures. For example, when growing a carbon nanotube array, a silicon wafer would be treated at about 900° C. after being fixed on a quartz plate. However, an application temperature range of conventional bonding methods is narrow, viscosity of the double-sided tape or adhesive used in conventional bonding methods is significantly reduced or even lost at high temperatures or at low temperatures.

Therefore, there is room for improvement within the art.

BRIEF DESCRIPTION OF THE DRAWINGS

Implementations of the present technology will now be described, by way of example only, with reference to the attached figures, wherein.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

The term "rough surface" is defined to be a surface with a surface roughness larger than 1.0 micrometer. The term "smooth surface" is defined to be a surface with a surface roughness less than 1.0 micrometer.

Figure 1:
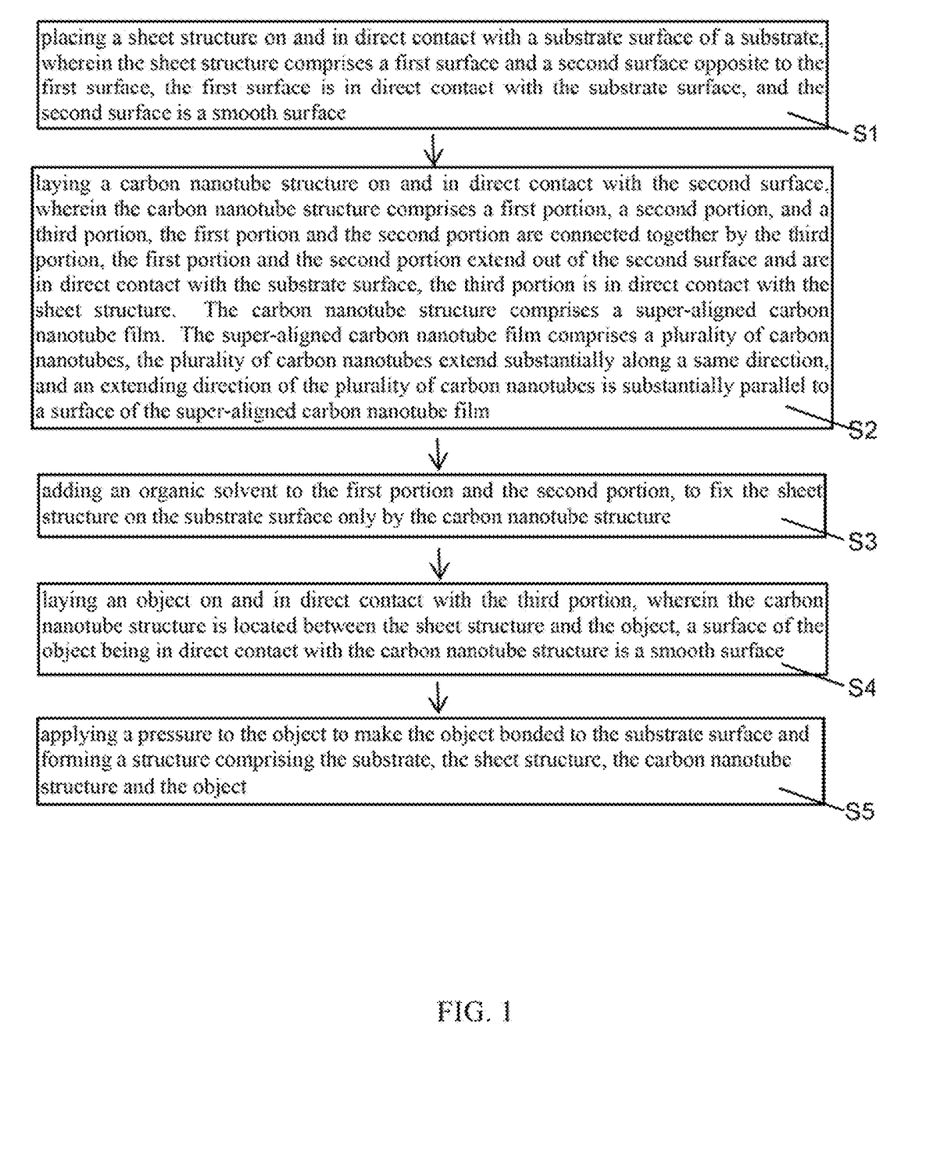
FIG. 1 is a flow diagram of a bonding method.
Figure 2:
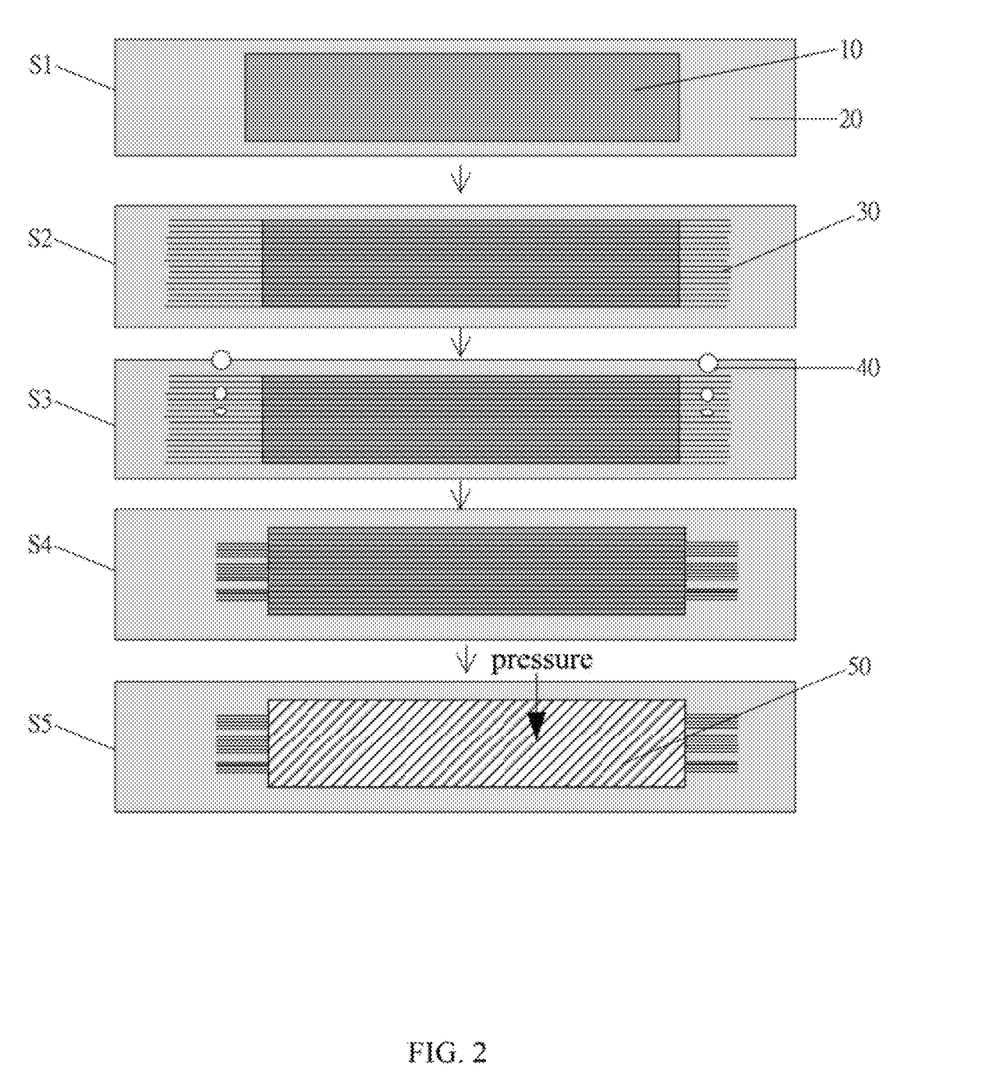
FIG. 2 is a schematic view of the bonding method in FIG. 1.

FIG. 1 and FIG. 2 show one embodiment of the present application in relation to a bonding method. The bonding method comprises blocks of:

block (S1), placing a sheet structure 10 on and in direct contact with a substrate surface 20 of a substrate, in which the sheet structure 10 comprises a first surface and a second surface opposite to the first surface, the first surface is in direct contact with the substrate surface 20, and the second surface is a smooth surface;

block (S2), laying a carbon nanotube structure 30 on and in direct contact with the second surface, in which the carbon nanotube structure 30 comprises a first portion, a second portion, and a third portion, the first portion and the second portion are connected together by the third portion, the first portion and the second portion extend out of the second surface and are in direct contact with the substrate surface 20, and the third portion is in direct contact with the sheet structure 10. The carbon nanotube structure 30 comprises a super-aligned carbon nanotube film. The super-aligned carbon nanotube film comprises a plurality of carbon nanotubes, the plurality of carbon nanotubes extend substantially along a same direction, and an extending direction of the plurality of carbon nanotubes is substantially parallel to a surface of the super-aligned carbon nanotube film;

block (S3), adding an organic solvent 40 to the first portion and the second portion, to fix the sheet structure 10 on the substrate surface 20 only by the carbon nanotube structure 30;

block (S4), laying an object 50 on and in direct contact with the third portion, in which the carbon nanotube structure 30 is located between the sheet structure 10 and the object 50, a surface of the object 50 being in direct contact with the carbon nanotube structure 30 is a smooth surface; and block (S5), applying a pressure to the object 50 to make the object 50 bonded to the substrate surface 20 and forming a structure comprising the substrate, the sheet structure 10, the carbon nanotube structure 30 and the object 50.

In block (S1), the substrate surface 20 can be a smooth surface or a rough surface. In one embodiment, the substrate surface 20 is a rough surface, and a surface roughness of the substrate surface 20 is from about 1 micrometer to 10 micrometers. In one embodiment, the surface roughness of the substrate surface 20 is from about 3 micrometers to about 5 micrometers. For example, the substrate surface 20 can be a frosted glass surface, a rough surface of quartz, or the like. In one embodiment, the substrate surface 20 is the rough surface of quartz, and a surface roughness of the rough surface of quartz is about 4 micrometers.

The carbon nanotube structure 30 and the second surface are joined together only by van der Waals force. If the second surface is too rough, such as a surface roughness of the second surface being larger than 1.0 micrometer, or the second surface being contaminated and not clean, then the van der Waals force between the carbon nanotube structure 30 and the second surface is decreased. The adhesion between the carbon nanotube structure 30 and the second surface thus decreases. In some embodiments, the second surface is a clean and smooth surface. The phrase "clean and smooth surface" refers the surface being substantially free of impurities, dust and the like, and having a small surface roughness. In one embodiment, the surface roughness of the second surface is less than or equal to 1.0 micrometer. In one embodiment, the surface roughness of the second surface is less than or equal to 500 nanometers. In one embodiment, the surface roughness of the second surface is less than or equal to 100 nanometers. When the second surface is a clean surface and the surface roughness is less than or equal to 1.0 micrometer, the van der Waals force between the carbon nanotube structure 30 and the second surface is large, therefore, there is greater adhesion between the carbon nanotube structure 30 and the second surface.

A material of the sheet structure 10 is not limited. Examples of the material of the sheet structure 10 can comprise glass, quartz, silicon, and polyethylene (PET). In one embodiment, the sheet structure 10 is a clean and smooth silicon wafer, and the surface roughness of the clean and smooth silicon wafer is about 5 nanometers.

In one embodiment, the first surface is smaller than the substrate surface 20. In one embodiment, both the first surface and the second surface are smaller than the substrate surface 20.

Figure 3:
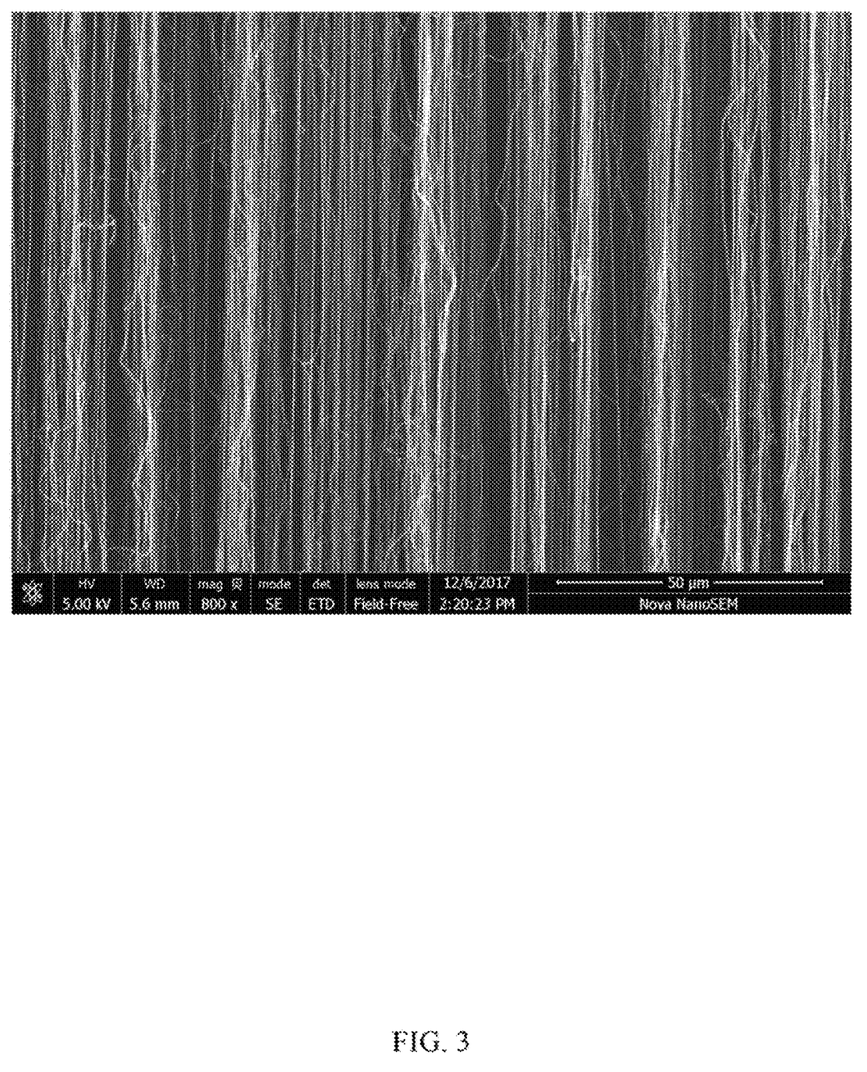
FIG. 3 shows a scanning electron microscope (SEM) image of a super-aligned carbon nanotube film.

In FIG. 3 block (B2) shows the plurality of carbon nanotubes extends substantially along the same direction implying that a majority of the carbon nanotubes of the super-aligned carbon nanotube film extend along the same direction, in which only a minority of carbon nanotubes may be randomly aligned. However, the number of randomly aligned carbon nanotubes is very small and does not affect the overall oriented alignment of the majority of carbon nanotubes of the super-aligned carbon nanotube film. The randomly aligned carbon nanotubes impose no significance to the overall structure and can be ignored. The plurality of carbon nanotubes of the super-aligned carbon nanotube film are joined end-to-end by van der Waals force. Adjacent carbon nanotubes along the extending direction are joined end-to-end by van der Waals force.

In one embodiment, the plurality of carbon nanotubes is pure carbon nanotubes. The pure carbon nanotubes mean that the carbon nanotubes are not modified by physical or chemical methods and there are few or no impurities adhered on surfaces of the carbon nanotubes, thus a purity of the carbon nanotubes is better than or equal to 99.9%. Therefore, the bonding method has substantially no environmental effects. Since the plurality of carbon nanotubes is pure carbon nanotubes, and a specific surface area of each of the plurality of carbon nanotube is very large, the super-aligned carbon nanotube film has strong viscosity. The carbon nanotube structure 30 therefore has strong viscosity. Therefore, the object 50 can be strongly bonded to the substrate surface 20 by the bonding method.

The super-aligned carbon nanotube film is a free-standing film. The term 'free-standing' means films that do not have to be supported by a substrate, and can be self-supporting to maintain a film shape. Therefore, the carbon nanotube structure 30 comprising the super-aligned carbon nanotube film can be directly laid on and in direct contact with the sheet structure 10.

Figure 4:
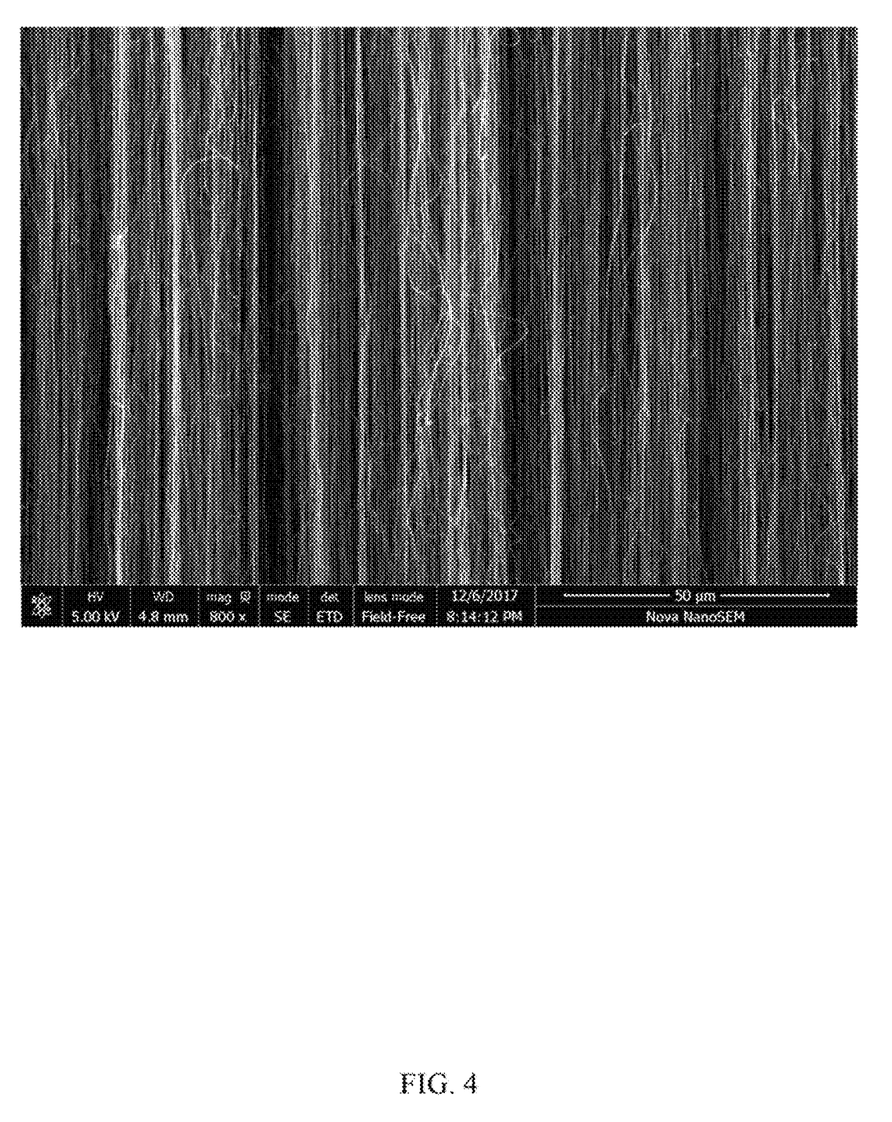
FIG. 4 is a structure schematic view of a carbon nanotube structure comprising at least two super-aligned carbon nanotube films.
Figure 5:
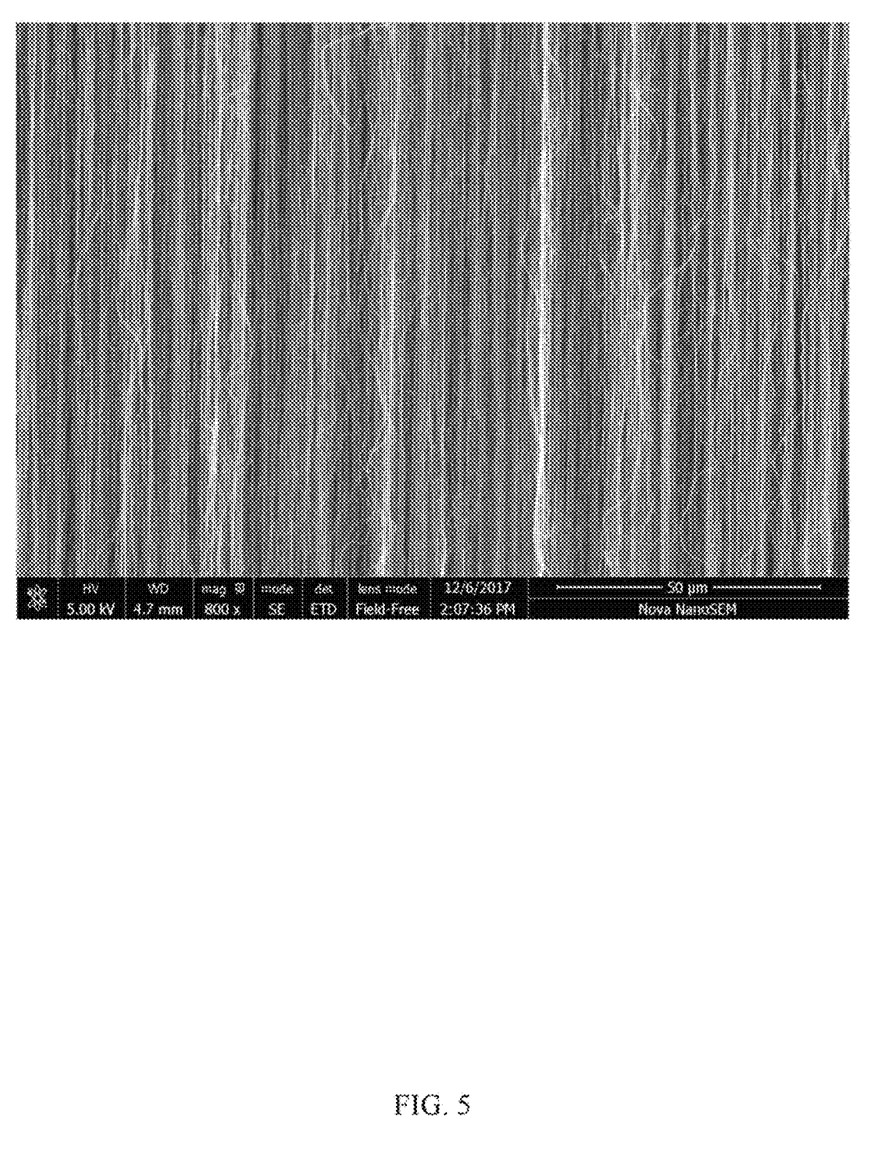
FIG. 5 shows a scanning electron microscope (SEM) image of a carbon nanotube structure comprising 8 layers of super-aligned carbon nanotube films.
Figure 6:
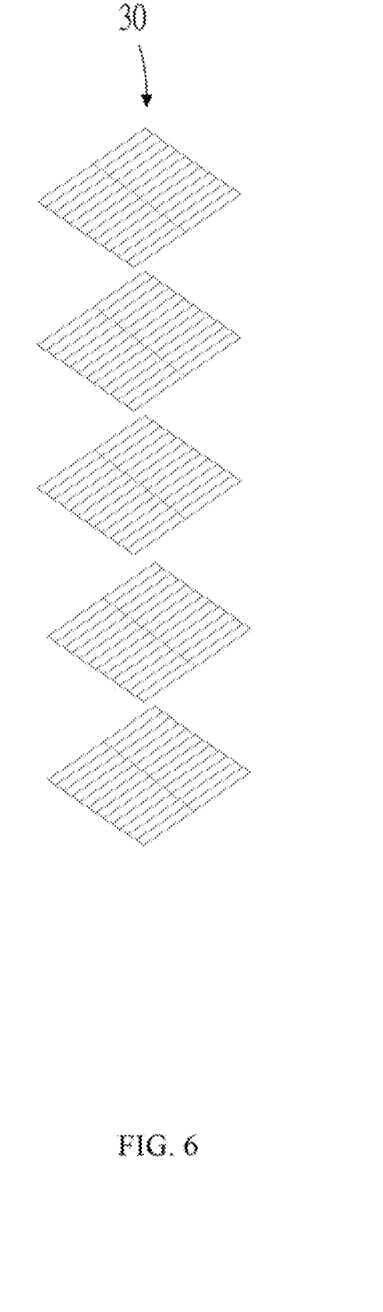
FIG. 6 shows a scanning electron microscope (SEM) image of a carbon nanotube structure comprising 50 layers of super-aligned carbon nanotube films.

FIGS. 4-6 show in one embodiment, the carbon nanotube structure 30 comprising at least two super-aligned carbon nanotube films, in which the at least two super-aligned carbon nanotube films are overlapped and parallel to each other. Adjacent super-aligned carbon nanotube films are closely joined by van der Waals force. The extending directions of the plurality of carbon nanotubes of the at least two super-aligned carbon nanotube films are substantially the same. "Substantially the same" refers a majority of the carbon nanotubes of the at least two super-aligned carbon nanotube film extend along the same direction, only a minority of carbon nanotubes may be randomly aligned. The randomly aligned carbon nanotubes do not affect the overall extending direction of most of the carbon nanotubes of the super-aligned carbon nanotube film, and thus can be ignored.

In one embodiment, the carbon nanotube structure 30 consists of one super-aligned carbon nanotube film, the method of laying a carbon nanotube structure 30 on and in direct contact with the second surface comprises: block (S21), providing a super-aligned carbon nanotube array; and block (S22), drawing the super-aligned carbon nanotube film from the super-aligned carbon nanotube array, and directly laying the super-aligned carbon nanotube film on the second surface without any other blocks of treating the super-aligned carbon nanotube film. For example, after drawing the super-aligned carbon nanotube film from the super-aligned carbon nanotube array and before laying the super-aligned carbon nanotube film on the second surface, the super-aligned carbon nanotube film is not modified by physical or chemical methods.

The block (S22) comprises: block (S221), selecting a plurality of carbon nanotube segments with a certain width from the super-aligned carbon nanotube array; and block (S222), stretching the plurality of carbon nanotube segments substantially perpendicularly to a growth direction of the super-aligned carbon nanotube array at a certain speed, to obtain the super-aligned carbon nanotube film, and directly laying the super-aligned carbon nanotube film on the second surface without any other blocks of treating the super-aligned carbon nanotube film.

The carbon nanotube structure 30 may comprise at least two super-aligned carbon nanotube films. The block (S22) further comprises block (S223), laying at least one super-aligned carbon nanotube film on the super-aligned carbon nanotube film obtained in block (S222), and the at least one super-aligned carbon nanotube film are overlapped and parallel to the super-aligned carbon nanotube film in block (S222).

In one embodiment, the method of laying the carbon nanotube structure 30 on and in direct contact with the second surface comprises: providing a support structure; drawing at least one super-aligned carbon nanotube film from the super-aligned carbon nanotube array, and laying the at least one super-aligned carbon nanotube film on the support structure, to form the carbon nanotube structure 30; and transferring the carbon nanotube structure 30 from the support structure to the second surface. The support structure can be a substrate or a frame structure. In one embodiment, the support structure is the frame structure; and the carbon nanotube structure 30 is partially suspended to form a suspended portion. The carbon nanotube structure 30 is transferred from the support structure to the second surface by directly placing the suspended portion on the second surface and then removing the frame structure.

Figure 7:
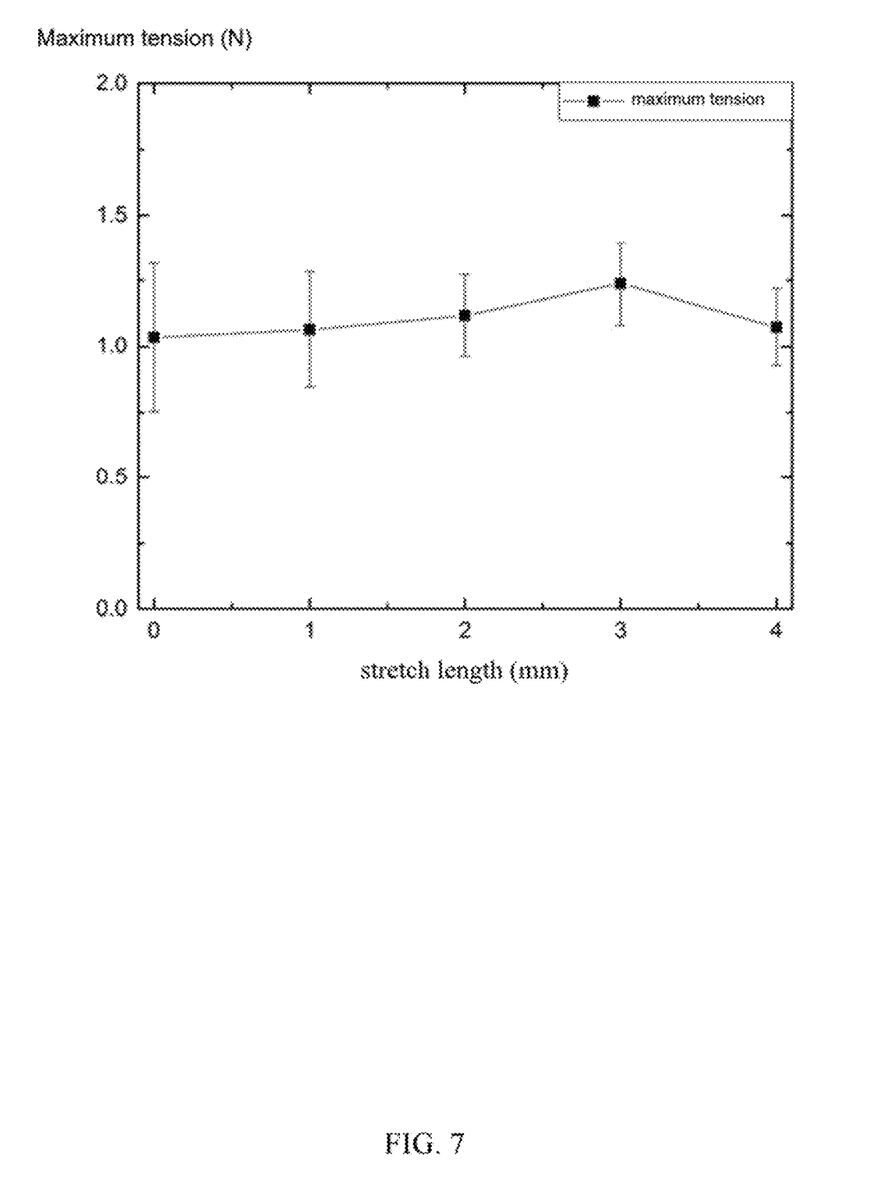
FIG. 7 shows a changing curve of a surface tension of silicon wafers with a changing stretch length of the carbon nanotube structure.

In one embodiment, in block (S22), after drawing the super-aligned carbon nanotube film from the super-aligned carbon nanotube array and before directly laying the super-aligned carbon nanotube film on the second surface, the super-aligned carbon nanotube film is stretched along the extend direction of the plurality of carbon nanotubes of the super-aligned carbon nanotube film. In some embodiments, a stretch length is from about 1 millimeter to about 3 millimeters, that is, a percentage of a stretch length and a length of the super-aligned carbon nanotube film before stretching ranges from about 0.574% to about 1.724%. In one embodiment, the stretch length is about 3 millimeters, that is, the percentage of the stretch length and the length of the super-aligned carbon nanotube film before stretching is about 0.574%. The stretching the super-aligned carbon nanotube film can make the extension directions of the randomly aligned carbon nanotubes consistent with the extension direction of the majority of the carbon nanotubes of the super-aligned carbon nanotube film, thereby smoothing the surface of the super-aligned carbon nanotube film. FIG. 7 shows different carbon nanotube structures being used to bond two square silicon wafers with a side length of 7 mm. Each of the different carbon nanotube structures comprises ten super-aligned carbon nanotube films. The stretch length of different carbon nanotube structure is different. A length of each of the different carbon nanotube structures before stretching is 174 mm. When the stretch length is less than 3 mm, which implies that a percentage of the stretch length and the length of each of the different carbon nanotube structures before stretching is less than 0.574, an adhesion between the two square silicon wafers increases with the increase in the stretch length. When the stretch length is larger than 3 mm, which implies that a percentage of the stretch length and the length of each of the different carbon nanotube structures before stretching is larger than 0.574, an adhesion between the two square silicon wafers decreases with the increase in the stretch length.

In block (S21), the plurality of carbon nanotubes of the super-aligned carbon nanotube array are pure. The pure carbon nanotubes mean that carbon nanotubes are not modified by physical or chemical processes, there being few or no impurities adhered on surface of the carbon nanotubes. In one embodiment, a length of each of the plurality of carbon nanotubes in the super-aligned carbon nanotube array is longer than 300 micrometers.

A method for making the super-aligned carbon nanotube array can be a chemical vapor deposition (CVD) method, an arc discharge preparation method or an aerosol preparation method. In one embodiment, the super-aligned carbon nanotube array is obtained by the chemical vapor deposition (CVD) method. The chemical vapor deposition (CVD) method comprises the blocks of (a) providing a substrate, in which the substrate can be selected from the group consisting of a P-type silicon substrate, an N-type silicon substrate, and a silicon substrate formed with an oxide layer. Then in block (b), a catalyst layer on a surface of the substrate is formed, in which a material of the catalyst layer can be selected from the group consisting of iron (Fe), cobalt (Co), nickel (Ni) and alloy of any combination thereof. Block (c) of annealing the substrate with the catalyst layer in air at 700° C. to 900° C. for about 30 minutes to 90 minutes; and block (d) of disposing the substrate in a reaction chamber, heating the reaction chamber in protective gas to 500° C.~740° C., introducing a carbon source gas into the reaction chamber for about 5 minutes to about 30 minutes, and growing the super-aligned carbon nanotube array from the substrate. A height of the carbon nanotube of the super-aligned carbon nanotube array is ranged from about 200 micrometers to about 400 micrometers. The carbon source gas can be chemically active hydrocarbons, such as acetylene. The protective gas can be nitrogen, ammonia, or inert a gas.

The number of the super-aligned carbon nanotube films of the carbon nanotube structure 30 can be selected according to actual needs. In one embodiment, the carbon nanotube structure 30 comprises 5 to 30 layers of the super-aligned carbon nanotube films overlapped and paralleled with each other. In one embodiment, the carbon nanotube structure 30 comprises 10 to 15 layers of the super-aligned carbon nanotube films overlapped and paralleled with each other. In another embodiment, the carbon nanotube structure 30 comprises 10 layers of the super-aligned carbon nanotube films overlapped and paralleled with each other.

Figure 8:
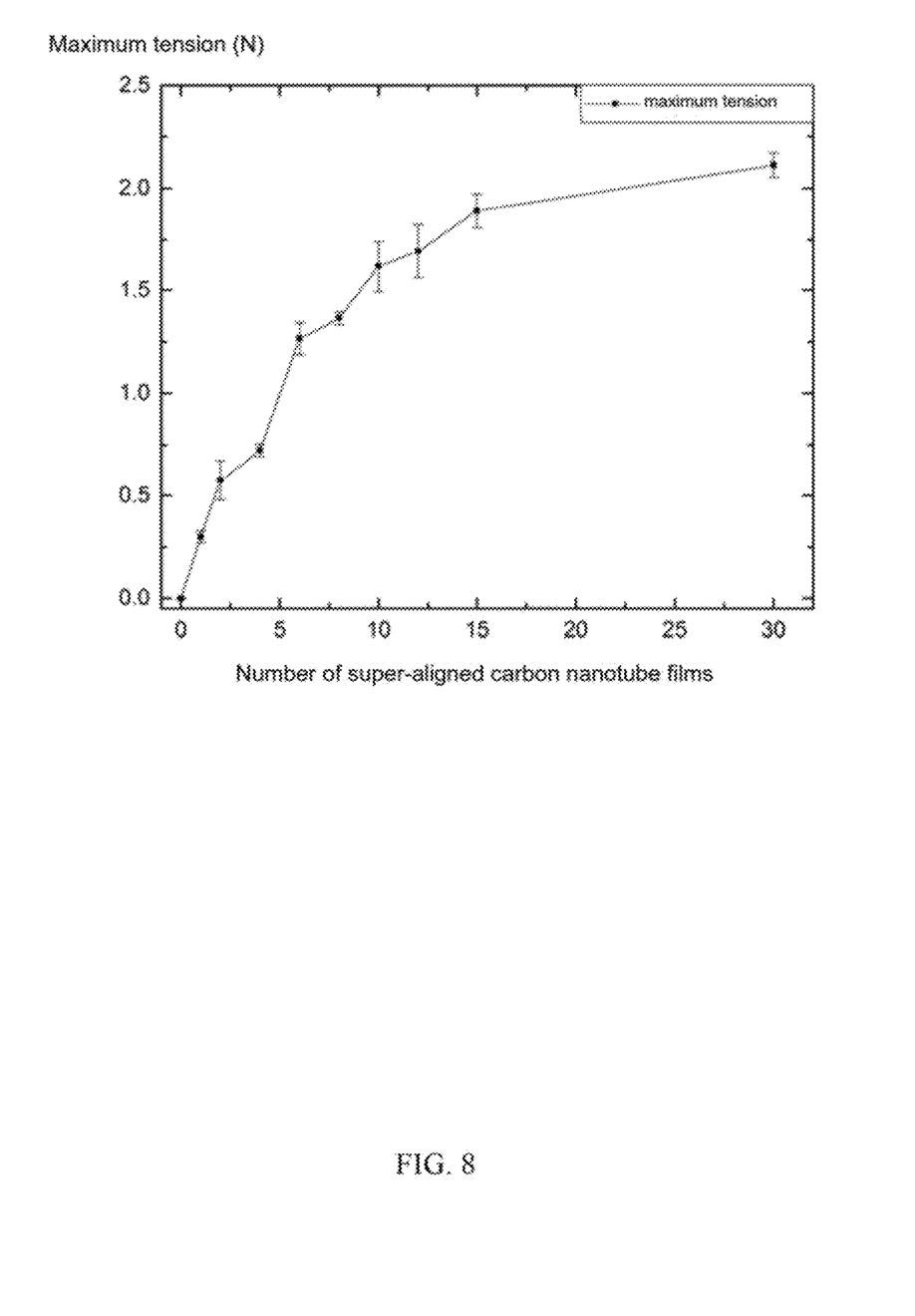
FIG. 8 shows a changing curve of a surface tension of silicon wafers with a changing of the number of super-aligned carbon nanotube layers of a carbon nanotube structure.

FIG. 8 shows different double-sided tapes comprising different numbers of super-aligned carbon nanotube films being used to bond two square silicon wafers with a side length of 7 mm and test results. When there is no super-aligned carbon nanotube film between the two square silicon wafers, the two square silicon wafers have no adhesion at all. As the number of the super-aligned carbon nanotube films in the carbon nanotube structure 30 increases, the adhesion between the two square silicon wafers increases. When the number of the super-aligned carbon nanotube films of the carbon nanotube structure 30 is greater than 15 layers, a rate of increase of the adhesion between the two square silicon wafers decreases with the increase in the number of the super-aligned carbon nanotube films.

In block (S3), the organic solvent 40 is a volatile organic solvent. Examples of the volatile organic solvent comprise ethanol, methanol, acetone, dichloroethane, chloroform, and the like. After the first portion and the second portion of the carbon nanotube structure 30 being in direct contact with the substrate surface 20 are treated by the organic solvent 40, the bonding force between the carbon nanotube structure 30 and the substrate surface 20 is increased under the surface tension of the volatile organic solvent, and the carbon nanotube structure 30 is bonded to the substrate surface 20.

Therefore, the sheet structure 10 is fixed on the substrate surface 20 by the carbon nanotube structure 30.

In block (S4), the carbon nanotube structure 30 is bonded with the object 50 only by van der Waals force. If the surface of the object 50 being in direct contact with the carbon nanotube structure 30 is too rough, meaning that the surface roughness of the surface of the object 50 is larger than 1.0 micrometer or the surface of the object 50 is not clean, the van der Waals force between the carbon nanotube structure 30 and the surface of the object 50 being in direct contact with the carbon nanotube structure 30 would decrease, and thus decreasing the adhesion between the carbon nanotube structure 30 and the surface of the object 50 being in direct contact with the carbon nanotube structure 30. In some embodiments, the surface of the object 50 being in direct contact with the carbon nanotube structure 30 is clean and has smooth surfaces. The term "clean and smooth surfaces" refers the surfaces are substantially free of impurities, dust and the like, and have a small surface roughness. In one embodiment, a surface roughness of the surface of the object 50 being in direct contact with the carbon nanotube structure 30 is less than or equal to 1.0 micrometer. In one embodiment, the surface roughness of the surface of the object 50 being in direct contact with the carbon nanotube structure 30 is less than or equal to 500 nanometers. In one embodiment, the surface roughness of the surface of the object 50 being in direct contact with the carbon nanotube structure 30 is less than or equal to 100 nanometers. When the surface roughness of the surface of the object 50 being in direct contact with the carbon nanotube structure 30 is less than or equal to 1.0 micrometer, the van der Waals force between the carbon nanotube structure 30 and the object 50 is large, therefore, improves the adhesion between the carbon nanotube structure 30 and the object 50.

Figure 9:
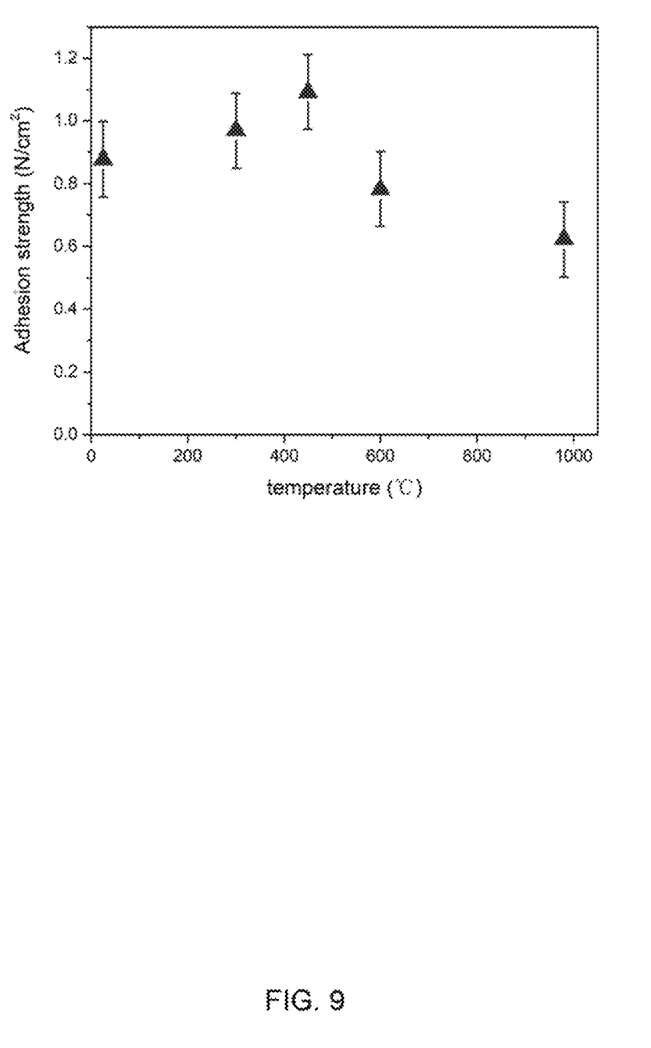
FIG. 9 shows a changing curve of adhesion strength of an object and a substrate surface with changing a temperature.

The carbon nanotube structure 30 bonds the object 50 and the sheet structure 10 together only by van der Waals force. Van der Waals force is little affected by temperature, therefore the carbon nanotube structure 30 used in the bonding method would possesses excellent viscosity at high and low temperatures. Furthermore, the absence or almost complete absence of impurities adhered on surfaces of the plurality of carbon nanotubes of the carbon nanotube structure 30, such as amorphous carbon or residual catalyst metal particles, gives high thermal stability to the carbon nanotube structure 30, and the carbon nanotube structure 30 is not readily oxidized even at a high temperature. Therefore, the bonding method can be performed at high and low temperatures. In one embodiment, the bonding method is performed at a temperature from about −196° C. to about 1000° C. In one embodiment, the bonding method is performed at a temperature from about −196° C. to about −100° C. In another embodiment, the bonding method is performed at a temperature from about 800° C. to about 1000° C. Referring to FIG. 9, the adhesion strength between the object 50 and the substrate surface 20 bonded by the bonding method minor changes with changing the temperature.

In block (S5), a magnitude of the pressure can be selected according to actual needs. In one embodiment, the amount of the pressure is ranged from about 10N to 20N. In one embodiment, the amount of the pressure is ranged from about 3N/cm² to about 5N/cm². In one embodiment, the amount of the pressure is about 5N/cm².

In one embodiment, after block (S5) further includes block (S6) in which the structure is cooled in an environment of −196° C.~−100° C.

In one embodiment, after block (S5) further includes block (S6) in which the structure is heated in an environment of about 800° C.~1000° C.

In one embodiment, the carbon nanotube structure 30 consists of at least one super-aligned carbon nanotube film, and the super-aligned carbon nanotube film consists of a plurality of carbon nanotubes. The plurality of carbon nanotubes extend substantially along a same direction and are joined end-to-end by van der Waals force.

In one embodiment, the carbon nanotube structure 30 consists of a plurality of carbon nanotubes. The plurality of carbon nanotubes are joined end-to-end by van der Waals force and extends substantially along a same direction, and an extending direction of the plurality of carbon nanotubes is parallel to a length direction of the carbon nanotube structure 30. The plurality of carbon nanotubes can be pure carbon nanotubes. The pure carbon nanotubes mean that carbon nanotubes are not modified by physical or chemical processes, there being few or no impurities adhered on surface of the carbon nanotubes, and a purity of the carbon nanotubes is better than or equal to 99.9%.

In some embodiments, in block (S3), the sheet structure 10 is fixed on the substrate surface 20 without adding the organic solvent to the first portion and the second portion. The sheet structure 10 may be fixed onto the substrate surface 20 by other methods. In one embodiment, the first portion and the second portion is fixed on the substrate surface 20 by glue, to fix the sheet structure 10 on the substrate surface 20.

In the bonding method, the carbon nanotube structure 30 bonds the object 50 and the sheet structure 10 together only by van der Waals force. When the object 50 needs to be separated from the substrate surface 20, only a small force is required, and no further heating or dissolving is needed. The carbon nanotube structure 30 can be removed from the object 50 without causing damage to the object 50 during or after the separation. Further, a position for bonding can be adjusted in the bonding method.

The above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the blocks of a method described may be removed, others may be added, and the sequence of blocks may be altered. The description and the claims drawn to a method may include some indication in reference to certain blocks. However, the indication used is only to be viewed for identification purposes and not as a suggestion as to an order for the blocks.

What is claimed is:

1. A bonding method comprising:
   placing a sheet structure on a substrate surface of a substrate, wherein a surface roughness of the substrate surface is larger than 1.0 micrometer; the sheet structure comprises a first surface and a second surface opposite to the first surface, the first surface is in direct contact with the substrate surface, and a surface roughness of the second surface is less than or equal to 1.0 micrometer;
   laying a carbon nanotube structure on the second surface, wherein the carbon nanotube structure comprises a first portion, a second portion, and a third portion, the first portion and the second portion are connected together by the third portion, the first portion and the second portion extend out of the second surface and are in direct contact with the substrate surface, the third portion is in direct contact with the sheet structure; the carbon nanotube structure comprises a super-aligned carbon nanotube film, the super-aligned carbon nanotube film comprises a plurality of carbon nanotubes, the plurality of carbon nanotubes extends substantially along a same direction, and an extending direction of the plurality of carbon nanotubes is substantially parallel to the second surface;

adding an organic solvent to the first portion and the second portion, to fix the sheet structure on the substrate surface only by the carbon nanotube structure;

laying an object on and in direct contact with the third portion, wherein the carbon nanotube structure is located between the sheet structure and the object, and a surface of the object being in direct contact with the third portion has a surface roughness less than or equal to 1.0 micrometer; and applying a pressure to the object to make the object bonded to the substrate surface and forming a structure comprising the substrate, the sheet structure, the carbon nanotube structure and the object.

2. The bonding method of claim 1, further comprising cooling the structure in an environment of about −196° C.~−100° C.

3. The bonding method of claim 1, further comprising heating the structure in an environment of about 800° C.~1000° C.

4. The bonding method of claim 1, wherein the bonding method is performed in an environment of about −196° C. to about 1000° C.

5. The bonding method of claim 4, wherein the bonding method is performed in an environment of about −196° C. to about −100° C.

6. The bonding method of claim 4, wherein the bonding method is performed in an environment of about 800° C. to about 1000° C.

7. The bonding method of claim 1, wherein the laying a carbon nanotube structure on and in direct contact with the second surface comprises:
providing a super-aligned carbon nanotube array;
drawing the super-aligned carbon nanotube film from the super-aligned carbon nanotube array; and
directly laying the super-aligned carbon nanotube film on the second surface.

8. The bonding method of claim 7, wherein the laying the carbon nanotube structure on and in direct contact with the first surface further comprises:
stretching the super-aligned carbon nanotube film along the extend direction of the plurality of carbon nanotubes of the super-aligned carbon nanotube film after drawing the super-aligned carbon nanotube film from the super-aligned carbon nanotube array and before directly laying the super-aligned carbon nanotube film on the second surface.

9. The bonding method of claim 8, wherein a percentage of a stretch length and a length of the super-aligned carbon nanotube film before stretching ranges from about 0.574% to about 1.724%.

10. The bonding method of claim 1, wherein the laying the carbon nanotube structure on and in direct contact with the second surface comprises:

drawing at least one super-aligned carbon nanotube film from a super-aligned carbon nanotube array;
laying the at least one super-aligned carbon nanotube film on a support structure, to form the carbon nanotube structure; and
transferring the carbon nanotube structure from the support structure to the second surface.

11. The bonding method of claim 10, wherein the support structure is a frame structure, the carbon nanotube structure is partially suspended to form a suspended portion; and the transferring the carbon nanotube structure from the support structure to the second surface comprises directly placing the suspended portion on the second surface; and then removing the frame structure.

12. The bonding method of claim 1, wherein an amount of the pressure ranges from about 3N/cm$^2$ to about 5N/cm$^2$.

13. The bonding method of claim 1, wherein the plurality of carbon nanotubes are pure carbon nanotubes.

14. The bonding method of claim 1, wherein the carbon nanotube structure comprises 10~15 layers of the super-aligned carbon nanotube films overlapped and paralleled with each other.

15. The bonding method of claim 1, wherein the carbon nanotube structure consists of at least one super-aligned carbon nanotube film and the super-aligned carbon nanotube film consists of a plurality of carbon nanotubes.

16. A bonding method of fixing an object on a substrate comprising:
placing a sheet structure on a substrate surface of the substrate, the sheet structure comprises a first surface and a second surface opposite to the first surface, the first surface is in direct contact with the substrate surface, and a surface roughness of the second surface is less than or equal to 1.0 micrometer;

laying a carbon nanotube structure on the second surface, wherein the carbon nanotube structure comprises a first portion, a second portion, and a third portion, the first portion and the second portion are connected together by the third portion, the first portion and the second portion extend out of the second surface and are in direct contact with the substrate surface, the third portion is in direct contact with the sheet structure; the carbon nanotube structure comprises a super-aligned carbon nanotube film, the super-aligned carbon nanotube film comprises a plurality of carbon nanotubes, the plurality of carbon nanotubes extends substantially along a same direction, and an extending direction of the plurality of carbon nanotubes is substantially parallel to the second surface;

fixing the first portion and the second portion on the substrate surface, and thus to fix the sheet structure on the substrate surface;

laying the object on and in direct contact with the third portion, wherein the carbon nanotube structure is located between the sheet structure and the object, and a surface of the object being in direct contact with the third portion has a surface roughness less than or equal to 1.0 micrometer; and applying a pressure to the object to make the object bonded to the substrate surface and forming a structure comprising the substrate, the sheet structure, the carbon nanotube structure and the object.

17. The bonding method of claim 16, further comprising cooling the structure in an environment of about −196° C.~−100° C.

18. The bonding method of claim 16, further comprising heating the structure in an environment of about 800° C.~1000° C.

19. The bonding method of claim 16, wherein the bonding method is performed in an environment of about −196° C. to about −100° C.

20. The bonding method of claim 16, wherein the bonding method is performed in an environment of about 800° C. to about 1000° C.

* * * * *